US007008825B1

(12) United States Patent
Bancod et al.

(10) Patent No.: US 7,008,825 B1
(45) Date of Patent: Mar. 7, 2006

(54) LEADFRAME STRIP HAVING ENHANCED TESTABILITY

(75) Inventors: Ludovico E. Bancod, Chandler, AZ (US); Leocadio M. Alabin, Sta Rosa (PH); Terry W. Davis, Gilbert, AZ (US); Ian Kent, Thoiry (FR)

(73) Assignee: Amkor Technology, Inc., Chandler, AZ (US)

( * ) Notice: Subject to any disclaimer, the term of this patent is extended or adjusted under 35 U.S.C. 154(b) by 176 days.

(21) Appl. No.: 10/445,754

(22) Filed: May 27, 2003

(51) Int. Cl.
*G01R 31/26* (2006.01)
*H01L 21/44* (2006.01)
*H01L 23/495* (2006.01)

(52) U.S. Cl. .................. 438/123; 438/15; 438/111; 257/666

(58) Field of Classification Search ........ 257/E23.031, 257/E23.032, 666; 438/15, 25, 51, 55, 64, 438/106, 111, 123, 14, FOR. 366, 369, FOR. 371, 438/377, FOR. 380
See application file for complete search history.

(56) References Cited

U.S. PATENT DOCUMENTS

| 2,596,993 | A | | 5/1952 | Gookin |
| 3,435,815 | A | | 4/1969 | Forcier |
| 3,734,660 | A | | 5/1973 | Davies et al. |
| 3,838,984 | A | | 10/1974 | Crane et al. |
| 4,054,238 | A | | 10/1977 | Lloyd et al. |
| 4,189,342 | A | | 2/1980 | Kock |
| 4,258,381 | A | | 3/1981 | Inaba |
| 4,289,922 | A | | 9/1981 | Devlin |
| 4,301,464 | A | | 11/1981 | Otsuki et al. |
| 4,332,537 | A | | 6/1982 | Slepcevic |
| 4,417,266 | A | | 11/1983 | Grabbe |
| 4,451,224 | A | | 5/1984 | Harding |
| 4,451,973 | A | * | 6/1984 | Tateno et al. .................. 29/827 |
| 4,530,152 | A | | 7/1985 | Roche et al. |
| 4,646,710 | A | | 3/1987 | Schmid et al. |
| 4,707,724 | A | | 11/1987 | Suzuki et al. |
| 4,727,633 | A | * | 3/1988 | Herrick .................... 228/124.6 |
| 4,737,839 | A | | 4/1988 | Burt |

(Continued)

FOREIGN PATENT DOCUMENTS

DE 19734794 A1 8/1997

(Continued)

*Primary Examiner*—Carl Whitehead, Jr.
*Assistant Examiner*—James M. Mitchell
(74) *Attorney, Agent, or Firm*—Stetina Brunda Garred & Brucker (57) ABSTRACT

A method of fabricating a semiconductor package comprising the step of providing a leadframe strip which defines a strip plane and a multiplicity of leadframes. Each of the leadframes includes an outer frame defining a central opening and a die pad disposed within the central opening. Each leadframe further includes a plurality of leads which are attached to the outer frame and extend toward the die pad in spaced relation to each other. The outer frames are integrally connected to each other and collectively define connecting bars which extend in multiple rows and columns and define saw streets. Semiconductor dies are attached to respective ones of the die pads, with the semiconductor dies being mechanically and electrically connected to the leads of respective ones of the leadframes. Thereafter, an encapsulant material is applied to the leadframe strip to form at least one mold cap which at least partially encapsulates the leadframes, the semiconductor dies, and the conductive wires. The leadframe strip and the mold cap collectively define a package strip. Isolation cuts are formed through the package strip along at least some of the saw streets to effectively electrically isolate the leadframes from each other.

21 Claims, 7 Drawing Sheets

U.S. PATENT DOCUMENTS

| | | | |
|---|---|---|---|
| 4,756,080 A | 7/1988 | Thorp, Jr. et al. | |
| 4,801,561 A * | 1/1989 | Sankhagowit | 29/827 |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,946,518 A * | 8/1990 | Spanjer et al. | 148/282 |
| 4,987,475 A | 1/1991 | Schlesinger et al. | |
| 5,018,003 A * | 5/1991 | Yasunaga et al. | 257/791 |
| 5,029,386 A | 7/1991 | Chao et al. | |
| 5,041,902 A | 8/1991 | McShane | |
| 5,059,379 A | 10/1991 | Tsutsumi et al. | |
| 5,065,223 A | 11/1991 | Matsuki et al. | |
| 5,066,614 A * | 11/1991 | Dunaway et al. | 228/180.21 |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,365,106 A | 11/1994 | Watanabe | |
| 5,381,042 A | 1/1995 | Lerner et al. | |
| 5,391,439 A * | 2/1995 | Tomita et al. | 428/571 |
| 5,406,124 A | 4/1995 | Morita et al. | |
| 5,410,180 A | 4/1995 | Fujii et al. | |
| 5,414,299 A | 5/1995 | Wang et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A * | 9/1995 | Chang | 29/827 |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,498,902 A * | 3/1996 | Hara | 257/686 |
| 5,508,556 A | 4/1996 | Lin | |
| 5,517,056 A | 5/1996 | Bigler et al. | |
| 5,521,429 A | 5/1996 | Aono et al. | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,604,376 A | 2/1997 | Hamburgen et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A * | 8/1997 | Tessier et al. | 29/841 |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,736,432 A | 4/1998 | Mackessy | |
| 5,745,984 A | 5/1998 | Cole, Jr. et al. | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,856,911 A | 1/1999 | Riley | |
| 5,859,471 A * | 1/1999 | Kuraishi et al. | 257/666 |
| 5,866,939 A | 2/1999 | Shin et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,915,998 A * | 6/1999 | Stidham et al. | 439/723 |
| 5,917,242 A | 6/1999 | Ball | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |
| 5,986,885 A | 11/1999 | Wyland | |
| 6,001,671 A | 12/1999 | Fjelstad | |
| 6,013,947 A | 1/2000 | Lim | |
| 6,018,189 A | 1/2000 | Mizuno | |
| 6,025,640 A | 2/2000 | Yagi et al. | |

| | | | | | | |
|---|---|---|---|---|---|---|
| 6,031,279 | A | 2/2000 | Lenz | 6,395,578 | B1 | 5/2002 Shin et al. |
| RE36,613 | E | 3/2000 | Ball | 6,399,415 | B1 * | 6/2002 Bayan et al. ............... 438/106 |
| 6,034,423 | A | 3/2000 | Mostafazadeh et al. | 6,400,004 | B1 | 6/2002 Fan et al. |
| 6,040,626 | A | 3/2000 | Cheah et al. | 6,414,385 | B1 | 7/2002 Huang et al. |
| 6,043,430 | A | 3/2000 | Chun | 6,424,024 | B1 * | 7/2002 Shih et al. .................. 257/667 |
| 6,060,768 | A | 5/2000 | Hayashida et al. | 6,437,429 | B1 | 8/2002 Su et al. |
| 6,060,769 | A | 5/2000 | Wark | 6,444,499 | B1 | 9/2002 Swiss et al. |
| 6,072,228 | A | 6/2000 | Hinkle et al. | 6,448,633 | B1 | 9/2002 Yee et al. |
| 6,075,284 | A | 6/2000 | Choi et al. | 6,452,279 | B1 | 9/2002 Shimoda |
| 6,081,029 | A | 6/2000 | Yamaguchi | 6,464,121 | B1 | 10/2002 Reijnders |
| 6,084,310 | A | 7/2000 | Mizuno et al. | 6,476,474 | B1 | 11/2002 Hung |
| 6,087,722 | A | 7/2000 | Lee et al. | 6,482,680 | B1 | 11/2002 Khor et al. |
| 6,100,594 | A | 8/2000 | Fukui et al. | 6,498,099 | B1 | 12/2002 McLellan et al. |
| 6,113,474 | A | 9/2000 | Costantini et al. | 6,498,392 | B1 | 12/2002 Azuma |
| 6,118,174 | A | 9/2000 | Kim | 6,507,120 | B1 | 1/2003 Lo et al. |
| 6,118,184 | A | 9/2000 | Ishio et al. | 6,559,525 | B1 | 5/2003 Huang |
| RE36,907 | E | 10/2000 | Templeton, Jr. et al. | 6,709,967 | B1 * | 3/2004 Evers ........................ 438/617 |
| 6,130,115 | A | 10/2000 | Okumura et al. | 2001/0008305 | A1 | 7/2001 McLellan et al. |
| 6,130,473 | A | 10/2000 | Mostafazadeh et al. | 2001/0014538 | A1 | 8/2001 Kwan et al. |
| 6,133,623 | A | 10/2000 | Otsuki et al. | 2002/0011654 | A1 | 1/2002 Kimura |
| 6,140,154 | A | 10/2000 | Hinkle et al. | 2002/0024122 | A1 | 2/2002 Jung et al. |
| 6,143,981 | A | 11/2000 | Glenn | 2002/0027297 | A1 | 3/2002 Ikenaga et al. |
| 6,169,329 | B1 | 1/2001 | Farnworth et al. | 2002/0140061 | A1 | 10/2002 Lee |
| 6,177,718 | B1 | 1/2001 | Kozono | 2002/0140068 | A1 | 10/2002 Lee et al. |
| 6,181,002 | B1 | 1/2001 | Juso et al. | 2002/0163015 | A1 | 11/2002 Lee et al. |
| 6,184,465 | B1 | 2/2001 | Corisis | 2002/0197826 | A1 * | 12/2002 Kim et al. .................. 438/460 |
| 6,194,777 | B1 | 2/2001 | Abbott et al. | 2003/0030131 | A1 * | 2/2003 Lee et al. .................... 257/666 |
| 6,197,615 | B1 | 3/2001 | Song et al. | 2003/0071333 | A1 * | 4/2003 Matsuzawa ................. 257/676 |
| 6,198,171 | B1 | 3/2001 | Huang et al. | 2003/0073265 | A1 | 4/2003 Hu et al. |
| 6,201,186 | B1 | 3/2001 | Daniels et al. | 2003/0168719 | A1 * | 9/2003 Cheng et al. ............... 257/666 |
| 6,201,292 | B1 | 3/2001 | Yagi et al. | 2003/0203541 | A1 * | 10/2003 Utsumi et al. .............. 438/112 |
| 6,204,554 | B1 | 3/2001 | Ewer et al. | 2003/0207498 | A1 * | 11/2003 Islam et al. ................. 438/120 |
| 6,208,020 | B1 | 3/2001 | Minamio | 2004/0026773 | A1 * | 2/2004 Koon et al. ................. 257/692 |
| 6,208,021 | B1 | 3/2001 | Ohuchi et al. | 2004/0029340 | A1 * | 2/2004 Rubin ........................ 438/232 |
| 6,208,023 | B1 | 3/2001 | Nakayama et al. | | | FOREIGN PATENT DOCUMENTS |
| 6,211,462 | B1 | 4/2001 | Carter, Jr. et al. | | | |
| 6,218,731 | B1 | 4/2001 | Huang et al. | EP | 5421117 | 6/1979 |
| 6,222,258 | B1 | 4/2001 | Asano et al. | EP | 5950939 | 3/1984 |
| 6,225,146 | B1 | 5/2001 | Yamaguchi et al. | EP | 0393997 | 10/1990 |
| 6,229,200 | B1 | 5/2001 | McLellan et al. | EP | 0459493 | 12/1991 |
| 6,229,205 | B1 | 5/2001 | Jeong et al. | EP | 0720225 | 3/1996 |
| 6,239,384 | B1 | 5/2001 | Smith et al. | EP | 0720234 | 3/1996 |
| 6,242,281 | B1 | 6/2001 | McLellan et al. | EP | 0794572 A2 | 10/1997 |
| 6,256,200 | B1 | 7/2001 | Lam et al. | EP | 0844665 | 5/1998 |
| 6,258,629 | B1 | 7/2001 | Niones et al. | EP | 0936671 | 8/1999 |
| 6,281,566 | B1 | 8/2001 | Magni | EP | 098968 | 3/2000 |
| 6,281,568 | B1 | 8/2001 | Glenn et al. | EP | 1032037 | 8/2000 |
| 6,282,095 | B1 | 8/2001 | Houghton et al. | JP | 55163868 | 12/1980 |
| 6,285,075 | B1 | 9/2001 | Combs et al. | JP | 5745959 | 3/1982 |
| 6,291,271 | B1 | 9/2001 | Lee et al. | JP | 58160095 | 8/1983 |
| 6,291,273 | B1 | 9/2001 | Miyaki et al. | JP | 359084556 * | 5/1984 |
| 6,294,100 | B1 | 9/2001 | Fan et al. | JP | 59208756 | 11/1984 |
| 6,294,830 | B1 | 9/2001 | Fjelstad | JP | 59227143 | 12/1984 |
| 6,295,977 | B1 | 10/2001 | Ripper et al. | JP | 60010756 | 1/1985 |
| 6,297,548 | B1 | 10/2001 | Moden et al. | JP | 60116239 | 8/1985 |
| 6,303,984 | B1 | 10/2001 | Corisis | JP | 60195957 | 10/1985 |
| 6,303,997 | B1 | 10/2001 | Lee | JP | 60231349 | 11/1985 |
| 6,307,272 | B1 | 10/2001 | Takahashi et al. | JP | 6139555 | 2/1986 |
| 6,309,909 | B1 | 10/2001 | Ohgiyama | JP | 629639 | 1/1987 |
| 6,316,838 | B1 | 11/2001 | Ozawa et al. | JP | 63067762 | 3/1988 |
| 6,323,550 | B1 | 11/2001 | Martin et al. | JP | 63205935 | 8/1988 |
| 6,326,243 | B1 | 12/2001 | Suzuya et al. | JP | 63233555 | 9/1988 |
| 6,326,244 | B1 | 12/2001 | Brooks et al. | JP | 63249345 | 10/1988 |
| 6,326,678 | B1 | 12/2001 | Karmezos et al. | JP | 63316470 | 12/1988 |
| 6,335,564 | B1 * | 1/2002 | Pour ........................ 257/666 | JP | 64054749 | 3/1989 |
| 6,339,255 | B1 | 1/2002 | Shin | JP | 1106456 | 4/1989 |
| 6,348,726 | B1 | 2/2002 | Bayan et al. | JP | 401196153 * | 8/1989 |
| 6,355,502 | B1 | 3/2002 | Kang et al. | JP | 1251747 | 10/1989 |
| 6,369,454 | B1 | 4/2002 | Chung | JP | 4098864 | 3/1992 |
| 6,373,127 | B1 | 4/2002 | Baudouin et al. | JP | 404158537 * | 6/1992 |
| 6,380,048 | B1 | 4/2002 | Boon et al. | JP | 5129473 | 5/1993 |
| 6,384,472 | B1 | 5/2002 | Huang | JP | 5166992 | 7/1993 |
| 6,388,336 | B1 | 5/2002 | Venkateshwaran et al. | | | |

| | | | | | | |
|---|---|---|---|---|---|---|
| JP | 5283460 | 10/1993 | | JP | 9293822 | 11/1997 |
| JP | 941979 | 1/1994 | | JP | 10022447 | 1/1998 |
| JP | 692076 | 4/1994 | | JP | 10163401 | 6/1998 |
| JP | 6140563 | 5/1994 | | JP | 10199934 | 7/1998 |
| JP | 6260532 | 9/1994 | | JP | 10256240 | 9/1998 |
| JP | 7297344 | 11/1995 | | JP | 00150765 | 5/2000 |
| JP | 7312405 | 11/1995 | | JP | 556398 | 10/2000 |
| JP | 864634 | 3/1996 | | KR | 9772358 | 11/1997 |
| JP | 8125066 | 5/1996 | | KR | 100220154 | 6/1999 |
| JP | 8222682 | 8/1996 | | KR | 0049944 | 6/2002 |
| JP | 8306853 | 11/1996 | | WO | 9956316 | 11/1999 |
| JP | 98205 | 1/1997 | | WO | 9967821 | 12/1999 |
| JP | 98206 | 1/1997 | | | | |
| JP | 98207 | 1/1997 | | | | |
| JP | 992775 | 4/1997 | | | | |

* cited by examiner

LEADFRAME STRIP HAVING ENHANCED TESTABILITY

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology and, more particularly, to a unique manufacturing methodology for a leadframe semiconductor package adapted to electrically isolate the semiconductor packages to facilitate leadframe strip testing, and to increase design flexibility and integration in leadframe semiconductor packages.

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package.

The leadframe is the central supporting structure of such a package. A portion of the leadframe is internal to the package (i.e., completely surrounded by the plastic encapsulant). Portions of the leads of the leadframe extend externally from the package or are partially exposed within the encapsulant material for use in electrically connecting the semiconductor package to another component. In certain semiconductor packages, a portion of the die pad of the leadframe also remains exposed within the exterior of the package for use as a heat sink.

For purposes of high-volume, low-cost production of semiconductor packages, a current industry practice is to etch or stamp a thin sheet of metal material to form a panel or strip which defines multiple lead frames. A single strip may be formed to include multiple arrays, with each such array including a multiplicity of leadframes in a particular pattern. In a typical semiconductor package manufacturing process, the integrated circuit dies are mounted and wire bonded to individual leadframes, with the encapsulant material then being applied to the strip so as to encapsulate the integrated circuit dies, bond wires, and portions of each of the leadframes in the above-described manner. The hardening of the encapsulant material facilitates the formation of a mold cap upon the leadframes.

Upon the hardening of the encapsulant material, the leadframes within the strip are cut apart or singulated for purposes of producing the individual semiconductor packages. Such singulation is typically accomplished via a saw singulation process. In this process, a saw blade is advanced along "saw streets" which extend in prescribed patterns between the leadframes as required to facilitate the separation of the leadframes from each other in the required manner. The advancement of the saw blade along the saw streets concurrently cuts the molded plastic mold cap, thus facilitating the formation of a molded plastic package body upon each of the separated leadframes.

It should be noted that the saw blade used in the saw singulation process cuts through copper (i.e., the metal material typically used to fabricate the strip) approximately ninety percent of the time. As a result, cutting through copper in this manner often disadvantageously results in the premature wear of the costly saw singulation blade.

Another drawback of the saw singulation process is that the same also typically results in the burring of the leads of the separated leadframes. Saw-generated burrs at the seating plan of each lead in the leadframe adversely affect solder mounting and joint reliability. In current semiconductor package fabrication methodologies, lead burrs are controlled by limiting the feed rate of the saw blade along the saw streets and by using specifically developed, high cost saw blades. However, as will be recognized, the use of the high cost saw blades is undesirable due to the resultant increase in production costs, with the reduced feed rates needed to control burring adversely affecting production speed, and thus efficiency.

When feasible, semiconductor package manufacturers improve singulation throughput by employing a gang cutting process. In the gang cutting process, an array of saw blades are spaced apart according to the spacing of the saw streets. Then, as cutting begins, the saw blades work simultaneously to cut along multiple saw streets at one time. Thus, several rows of leadframes are separated simultaneously, thereby increasing production speed. However, a single array of saw blades is typically usable for only one design of a multiple leadframe strip, and this unadaptability may inhibit semiconductor package design changes because of the costs associated with obtaining appropriate singulation tooling. Also, if one saw blade in the array becomes damaged or wears faster than the other blades in the array, the entire array must be replaced, thereby necessitating additional maintenance expenditures.

In order to eliminate the drawbacks of the gang cutting process, semiconductor package manufacturers have also employed manufacturing methodologies wherein the singulation process is accomplished using a wire saw cutter, allowing the cutting edge to span the entire saw street at one time. Though this particular singulation process improves manufacturing speeds and the need for frequent cutting tool replacement, it also possesses certain deficiencies which detract from its overall utility. More particularly, such process also requires that the saw street(s) along which the wire saw cutter(s) extend(s) be linear. Thus, such singulation process is not suited for use in conjunction with leadframe strips which include leadframes of differing configurations and require a series of staggered, non-linear cuts to complete the separation of the leadframes from each other. The use of the wire saw cutter(s) spanning the entire saw street(s) also does not completely eliminate the formation of sawing burrs on the leads. Moreover, each of the above-described singulation processes typically includes the cutting of the side rails of the leadframe strip which protrude outwardly from the mold cap. The sawing of these side rails weakens the leadframe strip in a manner making the same difficult to handle.

In certain applications, the wire saw cutter(s) described above cut(s) through only the metal of the leadframe strip along the saw street(s), leaving the mold cap intact. In this particular process, the wire saw cutter(s) is/are used to form one or more isolation cuts which effectively electrically isolate the semiconductor packages from each other, thus facilitating leadframe strip testing. However, in this particular process, the mold cap is normally subject to some degree of normal mold warpage which results in uneven saw depth in the isolation cut(s). This uneven saw depth gives rise to occurrences of cracking in the mold cap, and hence in the package bodies of the completely formed semiconductor packages.

The present invention addresses these particular deficiencies by providing a method wherein waterjet, laser or etching may be employed to electrically isolate semiconductor packages in a manner facilitating leadframe strip testing. The present invention also increases design flexibility and integration in leadframe semiconductor packages. These, and other advantages of the present invention, will be discussed in more detail below.

BRIEF SUMMARY OF THE INVENTION

The present invention provides a unique manufacturing methodology for semiconductor packages which is adapted to electrically isolate the semiconductor packages within a leadframe strip to facilitate strip testing and to increase design flexibility and integration in the semiconductor package. To accomplish this objective, waterjet, laser, or chemical etching is used to facilitate the creation of various isolation cuts which extend through the leadframe strip in a pattern which is configured to electrically isolate individual semiconductor packages in the strip from each other. The methodology of the present invention is applicable to leadframes having any one of a wide variety of different configurations. The present methodology also creates efficiencies in those singulation processes normally used to facilitate the complete separation of the semiconductor packages in the leadframe strip from each other, and substantially reduces instances of burring on the distal ends of the leads of the singulated semiconductor packages.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
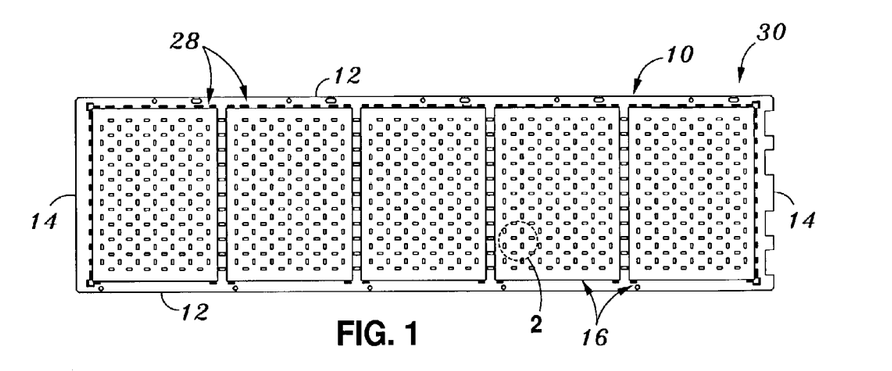
FIG. 1 is a top plan view of a leadframe strip which defines multiple interconnected leadframes and includes mold cap sections formed on one side thereof, the leadframe strip and mold caps being shown as including isolation cuts formed therein in a prescribed pattern in accordance with the present invention.
Figure 3:
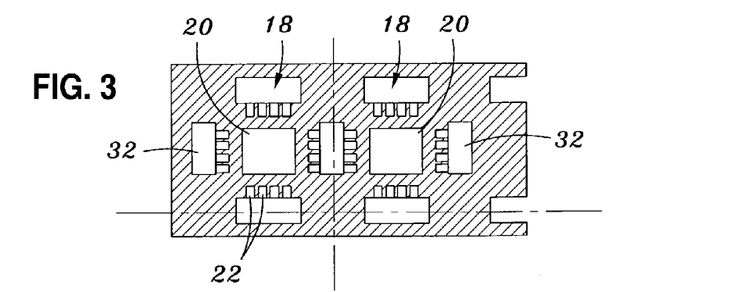
FIG. 3 is a partial bottom plan view of the leadframe strip shown in FIG. 1 illustrating the reverse side of the detail shown in FIG. 2.

Referring now to the drawings wherein the showings are for purposes of illustrating preferred embodiments of the present invention only, and not for purposes of limiting the same, FIG. 1 depicts a leadframe strip 10 constructed in accordance with the present invention. The strip 10 has a generally rectangular configuration, defining an opposed pair of longitudinal peripheral edge segments 12 and an opposed pair of lateral peripheral edge segments 14. The strip 10 defines multiple identically configured arrays 16. Each array 16 defines a multiplicity of leadframes 18 which are best shown in FIG. 3.

Each leadframe 18 includes an outer frame portion which defines a centrally positioned opening. Disposed within the opening is a die pad 20 which has a generally quadrangular configuration. The die pad 20 is typically connected to the outer frame portion by a plurality of tie bars of the leadframe 18 which extend to the outer frame portion from respective ones of the corner regions defined by the die pad 20. The tie bars facilitate the stable support of the die pad 20 inside the outer frame portion and, more particularly, within the opening defined thereby.

Each leadframe 18 further comprises a multiplicity of leads 22 which are integrally connected to the outer frame portion and protrude therefrom into the opening toward the peripheral edge of the die pad 20. As shown in FIG. 3, the leads 22 of the leadframe strip 10 are segregated into four sets, with each set being disposed in spaced relation to a respective one of the four peripheral edge segments defined by the die pad 20. The leads 22 of each set are also equidistantly spaced from each other, with narrow gaps of equal width being defined therebetween. As indicated above, the free, distal ends of the leads 22 are disposed in spaced relation to the peripheral edge of the die pad 20. Though not shown, it is contemplated that the leadframe strip 10 will not be fabricated to be of uniform thickness. In this regard, regions of the die pad 20, tie bars and leads 22 may be formed to have a thinner thickness than that of the remainder of the corresponding leadframe 18. More particularly, the die pad 20 may be formed in a manner wherein a recessed shelf extends about the periphery of the bottom surface thereof. Additionally, each of the leads 22 may be formed to include a region of reduced thickness at the distal end thereof. The tie bars may themselves be formed to have a maximum thickness less than that of the die pad 20 and leads 22 such that the tie bars are completely covered or encapsulated by a mold cap as will be described in more detail below. The leadframe strip 10 is fabricated from a conductive metal material (e.g., copper) through either a chemical etching or mechanical stamping process.

As indicated above, each array 16 of the strip 10 defines a multiplicity of leadframes 18. In each array 16, the outer frame portions of the leadframes 18 are integrally connected to each other such that the leadframes 18 are arranged in a matrix wherein the outer frame portions thereof collectively define connecting bars which extend in multiple rows and columns. Certain ones of the connecting bars define lateral saw streets 24 which extend perpendicularly between the longitudinal peripheral edge segments 12 of the strip 10. Certain ones of the connecting bars define longitudinal saw streets 26 which extend perpendicularly between the lateral peripheral edge segments 14 of the strip 10. The lateral saw streets 24 are defined by respective columns of the connecting bars, with the longitudinal saw streets 26 being defined by respective rows of the connecting bars. In the leadframe strip 10, each of the lateral saw streets 24 extends along a corresponding lateral axis defined by the strip 10, with each of the longitudinal saw streets 26 extending along a corresponding longitudinal axis of the leadframe strip 10. These lateral and longitudinal axes all extend along a common strip plane defined by the strip 10.

As shown in FIG. 1, sections of an encapsulant layer referred to as mold cap sections 28 are applied to one side of the leadframe strip 10. Each mold cap section 28 is applied to a respective one of the arrays 16 of the strip 10. Embedded within each mold cap section 28 is a plurality of integrated circuit dies disposed upon and attached to the top surfaces of respective ones of the die pads 20. Also embedded within each mold cap section 28 are conductive bond wires which are used to mechanically and electrically connect the pads or terminals of each integrated circuit die to the top surfaces of the leads 22 of the corresponding leadframe 18. The combination of the leadframe strip 10, mold cap sections 28, and the semiconductor dies and conductive wires embedded in the mold cap sections 28 collectively define a package strip 30.

As explained above, in conventional semiconductor package fabrication methodology, individual semiconductor packages are created as a result of the singulation or cutting of the package strip 30. Such singulation typically involves the advancement of either a single saw blade or a gang of saw blades along the lateral and longitudinal saw streets 24, 26, the saw blade(s) passing between the longitudinal peripheral edge segments 12 and the lateral peripheral edge segments 14 of the strip 10. As will be recognized, each saw blade typically has a width exceeding that of the connecting bars defining the lateral and longitudinal saw streets 24, 26, thus allowing the leads 22 of the individual leadframes 18 to be separated from each other as a result of the singulation process. As also explained above, in alternative singulation processes, wire saw cutters are used which span the entirety of the lateral and longitudinal saw streets 24, 26 at one time. In certain applications, these spanning wire saw cutters are used to cut only the metal of the leadframe strip 10 along the lateral and longitudinal saw streets 24, 26, and thus do not cut into the mold cap sections 28. The completion of these "isolation" cuts allows for the testing of the semiconductor packages prior to the completion of the singulation or separation process (i.e., the complete cutting of the mold cap sections 28). However, as also explained above, the formation of these isolation cuts as needed to provide for semiconductor package testing prior to complete singulation still gives rise to instances of the burring of the cut leads 22 and the formation of undesirable cracks within the mold cap sections 28.

Figure 2:
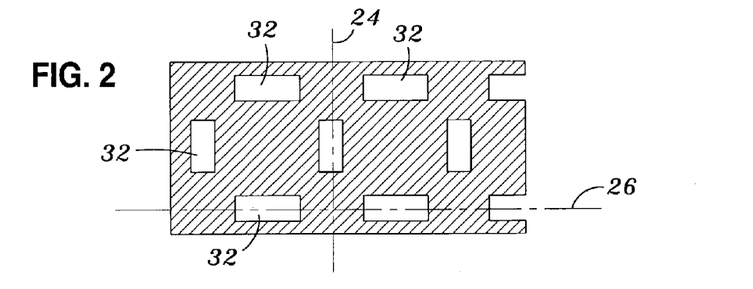
FIG. 2 is a partial top plan view of one of the mold cap sections included on the leadframe strip taken as an enlargement of the encircled region 2 shown in FIG. 1, and illustrating the isolation cuts included in such mold cap section.

In accordance with one embodiment of the present invention, it is contemplated that the semiconductor packages included in the package strip 30 may be electrically isolated from each other for allowing strip testing through the formation of a series of isolation cuts 32 within the package strip 30. Each of the isolation cuts 32 is preferably formed via waterjet or laser (e.g., a YAG laser). Each isolation cut 32 extends through the entirety of the package strip 30, and thus through the mold cap sections 28 and leadframe strip 10. It should be noted that the tape layer to which the leadframe strip 10 is normally initially applied is removed prior to the formation of the isolation cuts 32 in the package strip 30. As is seen in FIGS. 1–3, the isolation cuts 32 are formed along the lateral and longitudinal saw streets 24, 26. More particularly, the isolation cuts 32 included along each of the lateral and longitudinal saw streets 24, 26 are separated or spaced from each other by gaps corresponding to the gaps or spaces between each of the sets of leads 22 extending along the corresponding saw street 24, 26. Thus, as is best seen in FIG. 3, the isolation cuts 32 are formed in a manner which effectively separates adjacent sets of the leads 22 from each other. As a result of such separation, the leadframes 18 within the leadframe strip 10 are effectively electrically isolated from each other, thus allowing for the completion of subsequent testing procedures prior to the cutting or singulation of the package strip 30 in a manner facilitating the complete separation of the individual semiconductor packages from each other. Advantageously, the isolation cuts 32, though severing the leads 22 from the corresponding outer frame portions of the leadframes 18, do not cause any resultant burring on the distal ends of the leads 22. Moreover, in the follow-up saw singulation process typically used to facilitate the complete separation of the semiconductor packages of the package strip 30 from each other, the saw blade or wire saw cutter advancing along the lateral and longitudinal saw streets 24, 26 is required to cut through substantially less metal material of the leadframe strip 10, thus promoting increased singulation speeds and greater longevity in saw blade or wire saw cutter life.

Figure 4:
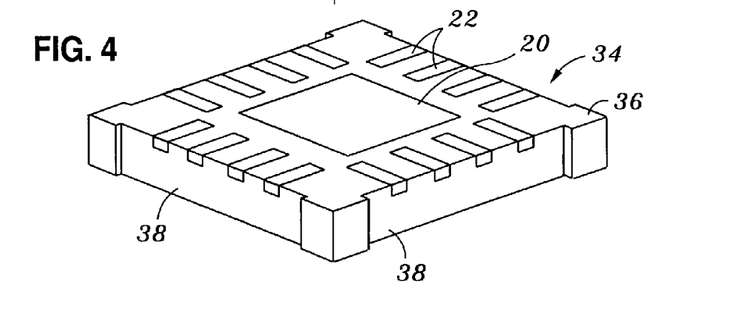
FIG. 4 is a bottom perspective view of a semiconductor package formed as a result of the complete singulation of the leadframe strip shown in FIG. 1.

FIG. 4 perspectively illustrates a semiconductor package 34 formed as a result of the complete singulation of the package strip 30 including the isolation cuts 32 shown in FIGS. 1–3. As indicated above, the complete singulation typically involves the initial formation of the isolation cuts 32 via waterjet or laser, and subsequent saw singulation of the package strip 30 subsequent to the completion of a testing protocol thereon. As shown in FIG. 4, as a result of the formation of the isolation cuts 32 in the package strip 30, the package body 36 of the semiconductor package 34 does not define generally planar side surfaces. Rather, each of the side surfaces of the package body 36 includes a rectangularly configured recess 38 formed therein. As will be recognized, each recess 38 essentially comprises a portion of one of the isolation cuts 32. Apparent from FIG. 4 is the relatively small size of those portions of the package strip 10 which must be subjected to the follow-up saw cut as a result of the formation of the isolation cuts 32 in the package strip 30.

Though not shown, it is contemplated that as an alternative to the use of waterjet or laser, isolation cuts may be formed in the package strip 10 through the use of a chemical etching process. Such isolation cuts would be provided in substantially the same shape and pattern as the isolation cuts 32 described above. However, the isolation cuts formed through the implementation of a chemical etching process would not extend through the entirety of the mold cap sections 28, but rather would terminate after passing through the metal of the leadframe strip 10. Though not passing through the mold cap sections 28, the chemically etched isolation cuts would still provide the advantages of eliminating the formation of burrs on the severed ends of the leads 22, and further reducing the amount of metal (i.e., the leadframe strip 10) which must be cut during the follow-up saw singulation process used to facilitate the separation of the semiconductor packages in the package strip 30 from each other.

Figure 5:
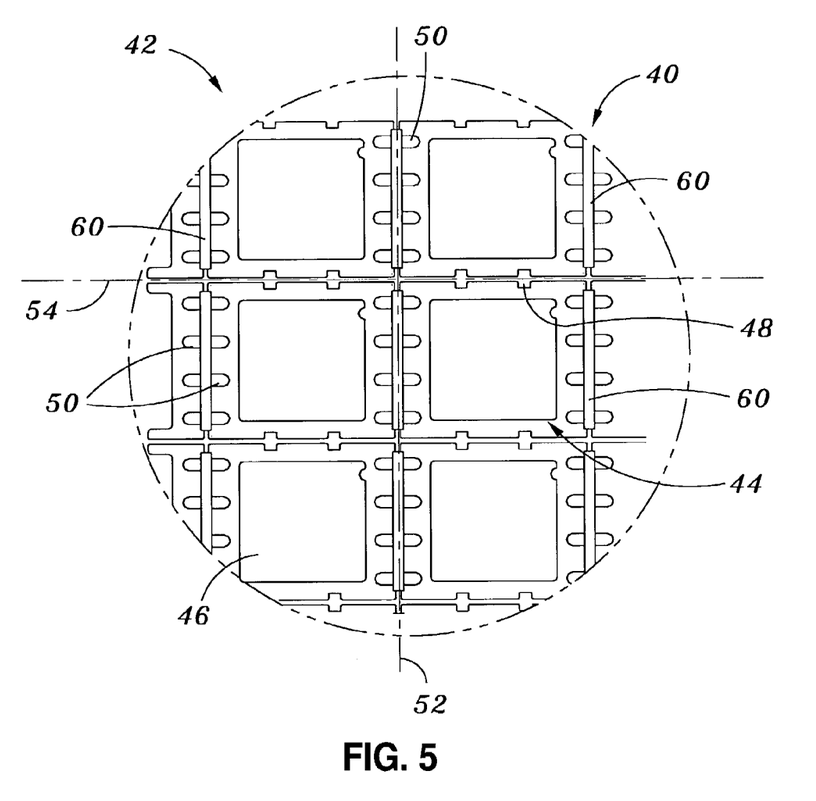
FIG. 5 is a partial bottom plan view of an alternatively configured leadframe strip including isolation cuts formed therein in a prescribed pattern in accordance with the present invention.

Referring now to FIG. 5, there is shown a partial bottom plan view of a package strip 40 which includes a leadframe strip 42 having a configuration differing from that of the above-described leadframe strip 10. Like the strip 10, the leadframe strip 42 defines multiple identically configured arrays, each of which defines a multiplicity of leadframes 44. Each leadframe 44 includes an outer frame portion which defines a centrally positioned opening. Disposed within the opening is a die pad 46 which has a generally quadrangular configuration. The die pad 46 is connected to the outer frame portion by a plurality of tie bars 48 which are segregated into two pairs, each pair of the tie bars 48 extending from the outer frame portion to a respective one of an opposed pair of the peripheral edge segments defined by the die pad 46. The tie bars 48 facilitate the stable support of the die pad 46 inside the outer frame portion.

Each leadframe 44 further comprises a multiplicity of leads 50 which are integrally connected to the outer frame portion and protrude therefrom into the opening toward the peripheral edge of the die pad 46. As shown in FIG. 5, the leads 50 are segregated into two sets, with each set being disposed in spaced relation to a respective one of an opposed pair of the peripheral edge segments defined by the die pad 46. In this regard, the two sets of leads 50 and the two pairs of tie bars 48 each extend to or toward respective opposed pairs of the peripheral edge segments of the die pad 46. As in the leadframe strip 10 described above, the leadframe strip 42 may be fabricated to be of non-uniform thickness. The leadframe strip 42 is also preferably fabricated from a conductive metal material through either a chemical etching or mechanical stamping process.

In each array of the leadframe strip 42, the outer frame portions of the leadframes 44 are integrally connected such that the leadframes 44 are arranged in a matrix wherein the outer frame portions thereof collectively define connecting bars which extend in multiple rows and columns. Certain ones of the connecting bars define lateral saw streets 52 which extend perpendicularly between the longitudinal peripheral edge segments of the strip 42. Certain ones of the connecting bars define longitudinal saw streets 54 which extend perpendicularly between the lateral peripheral edge segments of the strip 42. The lateral saw streets 52 are defined by respective columns of the connecting bars, with the longitudinal saw streets 54 being defined by respective rows of the connecting bars. In the strip 42, each of the lateral saw streets 52 extends along a corresponding lateral axis defined by the strip 42, with each of the longitudinal saw streets 54 extending along a corresponding longitudinal axis of the strip 42. These lateral and longitudinal axes all extend along a common strip plane defined by the strip 42.

Figures 6, 7:
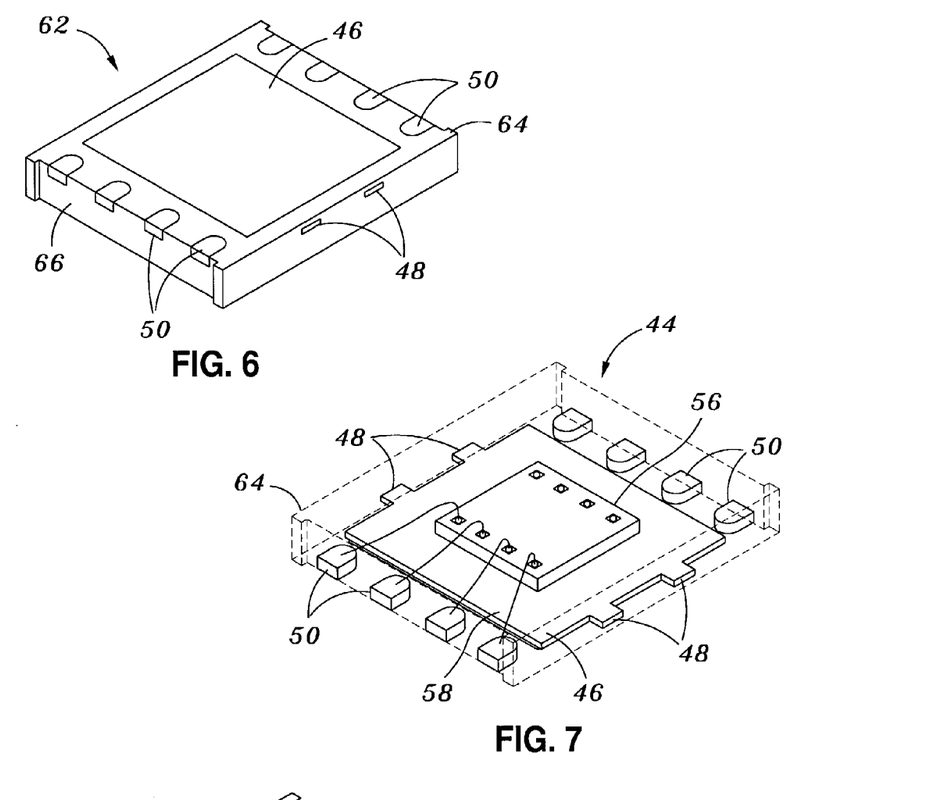
FIG. 6 is a bottom perspective view of a semiconductor package fabricated as a result of the complete singulation of the leadframe strip shown in FIG. 5.
FIG. 7 is a top perspective view of the semiconductor package shown in FIG. 6, illustrating the package body of the semiconductor package in phantom.

In the package strip 40, mold cap sections similar to the mold cap sections 28 described above are applied to one side of the leadframe strip 42. Embedded within each mold cap section is a plurality of integrated circuit dies 56, one of which is shown in FIG. 7. The integrated circuit dies 56 are disposed upon and attached to the top surfaces of respective ones of the die pads 46. Also embedded within each mold cap section are conductive wires 58 (also shown in FIG. 7) which are used to mechanically and electrically connect the pads or terminals of each integrated circuit die 56 to the top surfaces of the leads 50 of the corresponding leadframe 44. Thus, the package strip 40 comprises the combination of the leadframe strip 42, mold cap sections, semiconductor dies 56 and conductive wires 58 embedded in the mold cap sections.

In accordance with the present invention, it is contemplated that the semiconductor packages included in the package strip 40 may be electrically isolated from each other for allowing strip testing through the formation of a series of isolation cuts 60 within the package strip 40. Like the isolation cuts 32 described above, each of the isolation cuts 60 is preferably formed via waterjet or laser. Each isolation cut 60 extends through the entirety of the package strip 40, and thus through the mold cap sections and the leadframe strip 42. As seen in FIG. 5, the isolation cuts 60 are formed along only the lateral saw streets 52. In this regard, the isolation cuts 60 included along each of the lateral saw streets 52 are separated or spaced from each other by gaps corresponding to the gaps or spaces between each of the sets of leads 50 extending along the corresponding lateral saw street 52. Thus, the isolation cuts 60 are formed in a manner which effectively separates adjacent sets of the leads 50 from each other. As a result of such separation, the leadframes 44 within the leadframe strip 42 are effectively electrically isolated from each other, thus allowing for the completion of subsequent testing procedures prior to the cutting or singulation of the package strip 40 in a manner facilitating the complete separation of the individual semiconductor packages from each other. The isolation cuts 60, though severing the leads 50 from each other, do not cause any resultant burring on the distal ends of the leads 50. Additionally, in the follow-up saw singulation process typically used to facilitate the complete separation of the semiconductor packages of the package strip 40 from each other, the saw blade or wire saw cutter advancing along the lateral saw streets 52 is required to cut through substantially less material of the package strip 40, thus promoting increased singulation speeds and greater longevity in saw blade or wire saw cutter life.

FIG. 6 perspectively illustrates a semiconductor package 62 formed as a result of the complete singulation of the package strip 40 including the isolation cuts 60 shown in FIG. 5. The complete singulation of the package strip 40 involves the initial formation of the isolation cuts 60 via waterjet or laser. Thereafter, the package strip 40 is subjected to a saw singulation process wherein the above-described saw blade(s) or wire saw cutter(s) are advanced along the lateral and longitudinal saw streets 52, 54. As will be recognized, the advancement of such saw blade(s) or wire saw cutter(s) along the lateral saw streets 52 effectively cuts through the mold cap sections of the package strip 40, with the advancement of the saw blade(s) or wire saw cutter(s) along the longitudinal saw streets 54 cutting both the mold cap sections and longitudinal connecting bars of the leadframe strip 42. In this regard, the cutting or singulation of the longitudinal connecting bars effectively separates the tie bars 48 of the leadframes 44 from the outer frame portions thereof.

As shown in FIG. 6, as a result of the formation of the isolation cuts 60 in the package strip 40, an opposed pair of the side surfaces of the package body 64 of the semiconductor package 62 are non-planar. In this regard, each of these non-planar side surfaces of the package body 64 includes a rectangularly configured recess 66 formed therein. Each recess 66 comprises a portion of one of the isolation cuts 60. The remaining pair of opposed side surfaces of the package body 64 are generally planar, with the severed distal ends of each pair of the tie bars 48 being exposed in and substantially flush with a respective one of such planar side surfaces. FIG. 7 provides an additional perspective view of the semiconductor package 62, with the package body 64 thereof being shown in phantom.

It is also contemplated that as an alternative to the use of waterjet or laser, isolation cuts may be formed in the package strip 40 through the use of a chemical etching process. Such isolation cuts would be provided in substantially the same shape and pattern as the isolation cuts 60 described above. However, the isolation cuts formed through the implementation of a chemical etching process would not extend through the entirety of the mold cap sections of the package strip 40, but rather would terminate after passing through the metal of the leadframe strip 42. Such chemically etched isolation cuts would provide the same advantages described above in relation to the package strip 30.

Figure 8:
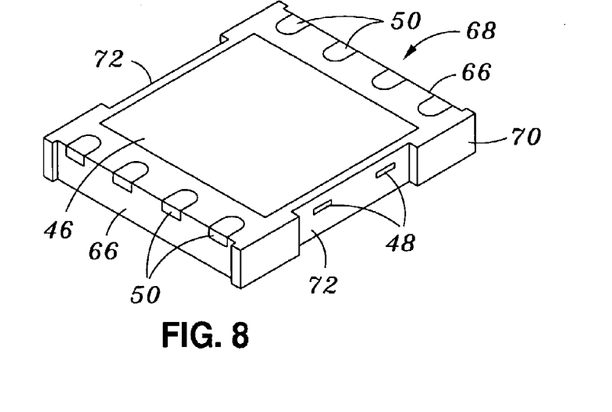
FIG. 8 is a bottom perspective view of a semiconductor package fabricated as a result of the inclusion of an increased number of isolation cuts in the leadframe strip shown in FIG. 5.

Referring now to FIG. 8, there is shown in perspective a semiconductor package 68 which is formed as a result of the complete singulation of the above-described package strip 40. The manufacturing methodology associated with the semiconductor package 68 differs from that described above in relation to the semiconductor package 62 in that additional isolation cuts are formed in the package strip 40 along each of the longitudinal saw streets 54 (in addition to the isolation cuts 60 included along each of the lateral saw streets 52). In this regard, such additional isolation cuts are formed in the package strip 40 in a manner effectively separating the tie bars 48 from the corresponding connecting bars, and thus separating each adjacent pair of tie bars 48 from each other. Thus, in addition to including the above-described recesses 66 in respective ones of an opposed pair of side surfaces thereof, the package body 70 of the semiconductor package 68 further includes an additional pair of recesses 72 disposed within respective ones of the remaining opposed pair of side surfaces of the package body 70. These additional recesses 72 each comprise a portion of one of the additional isolation cuts formed along the longitudinal saw streets 54 of the package strip 40. It will be recognized that these additional isolation cuts may also be formed through the implementation of a chemical etching process in the above-described manner as an alternative to the use of waterjet or laser.

Figure 9:
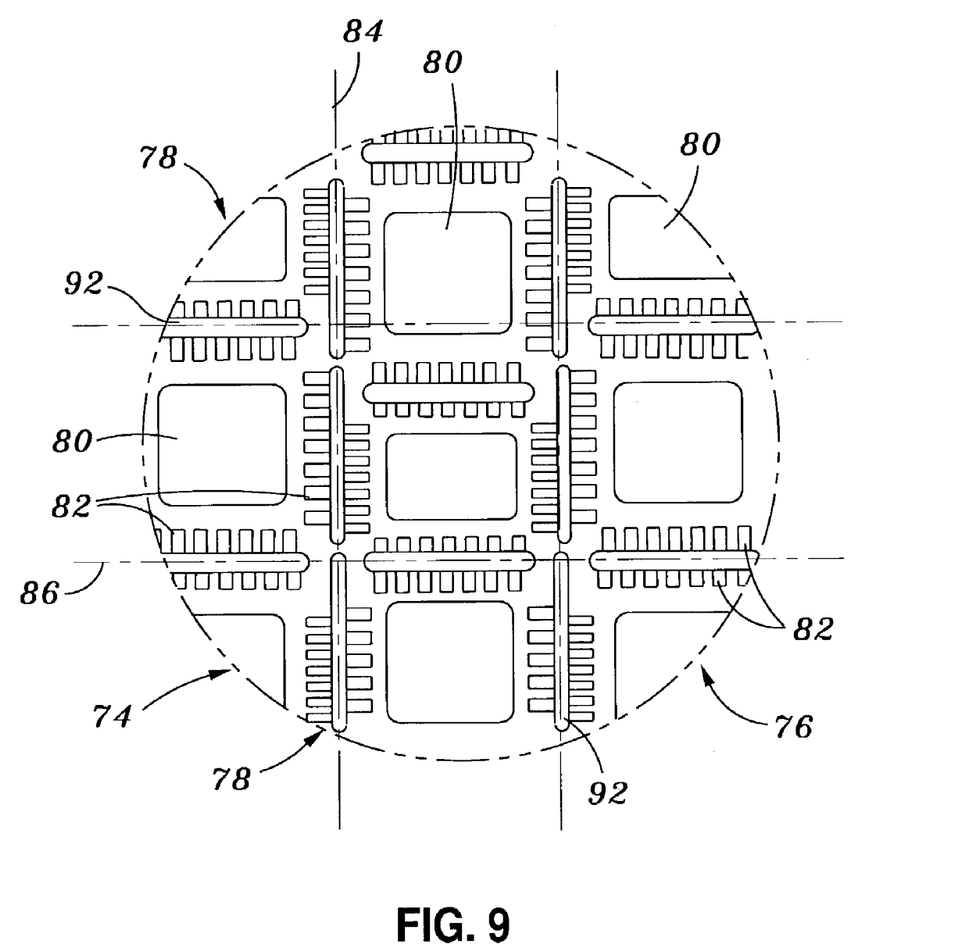
FIG. 9 is a partial bottom plan view of an alternatively configured leadframe strip including isolation cuts formed therein in a prescribed pattern in accordance with the present invention.
Figure 10:
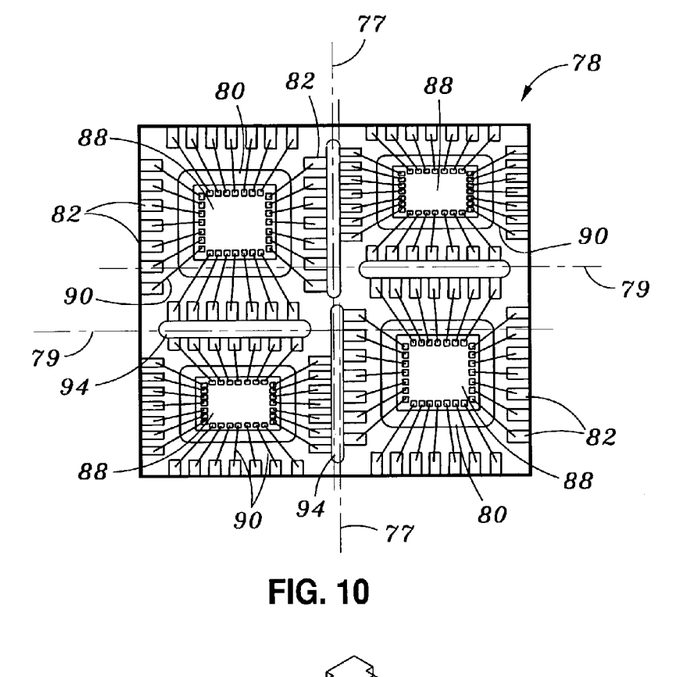
FIG. 10 is a top plan view of a portion of the leadframe strip shown in FIG. 9, omitting the mold cap section normally applied thereto.

Referring now to FIG. 9, there is shown a partial bottom plan view of a package strip 74 which includes a leadframe strip 76 having a configuration differing from that of the above-described leadframe strips 10, 42. The leadframe strip 76 also defines multiple identically configured arrays, each of which defines a multiplicity of leadframes 78. As is best seen in FIGS. 9 and 10, each leadframe 78 includes an outer frame portion which defines a centrally positioned opening. Disposed within the opening are a plurality of support bars which are connected to the outer frame portion and to each other. As shown, the support bars extend at substantially right angles relative to the outer frame portion and to each other, though other relative orientations are contemplated. As seen in FIG. 10, certain ones of these support bars extend along respective ones of a series of first leadframe axes 77 which extend in spaced, generally parallel relation to each other. Certain ones of the support bars extend along respective ones of a series of second leadframe axes 79 which also extend in spaced, generally parallel relation to each other and in generally perpendicular relation to the first leadframe axes 77. The first leadframe axes 77 also extend perpendicularly between opposed sides of the outer frame portion of the leadframe 78, with the second leadframe axes 79 extending perpendicularly between the remaining pair of opposed sides of the outer frame portion of the leadframe 78.

Also disposed within the opening defined by the outer frame portion of the leadframe 78 is a plurality of die pads 80, each of which has a generally quadrangular configuration. As seen in FIG. 10, though each having a quadrangular configuration, the die pads 80 are not of identical size. Each of the die pads 80 is preferably connected to the outer frame portion and to one or more of the support bars by tie bars which facilitate the stable support of the die pads 80 inside the outer frame portion. As further seen in FIG. 10, each die pad 80 is separated from the remaining die pads 80 by at least two of the support bars extending along at least one first leadframe axis 77 and at least one second leadframe axis 79.

Each leadframe 78 further comprises a multiplicity of leads 82. Certain ones of the leads 82 are integrally connected to the outer frame portion and protrude therefrom into the opening toward certain ones of the peripheral edges of respective ones of the die pads 80. Other ones of the leads 82 are integrally connected to the support bars and protrude therefrom toward certain ones of the peripheral edges of respective ones of the die pads 80. The leadframe strip 76 may itself be fabricated to be of non-uniform thickness, and is also preferably fabricated from a conductive metal material through either a chemical etching or mechanical stamping process.

In each array of the leadframe strip 76, the outer frame portions of the leadframes 78 are integrally connected such that the leadframes 78 are arranged in a matrix wherein the outer frame portions thereof collectively define connecting bars which extend in multiple rows and columns. Certain ones of the connecting bars define lateral saw streets 84 which extend perpendicularly between the longitudinal peripheral edge segments of the strip 76. Certain ones of the connecting bars define longitudinal saw streets 86 which extend perpendicularly between the lateral peripheral edge segments of the strip 76. The lateral saw streets 84 are defined by respective columns of the connecting bars, with the longitudinal saw streets 86 being defined by respective rows of the connecting bars. In the strip 76, each of the lateral saw streets 84 extends along a corresponding lateral axis defined by the strip 76, with each of the longitudinal saw streets 86 extending along a corresponding longitudinal axis of the strip 76. These lateral and longitudinal axes all extend along a common strip plane defined by the strip 76.

In the package strip 74, mold cap sections similar to the mold cap sections 28 described above are applied to one side of the leadframe strip 76. Embedded within each mold cap section is a plurality of integrated circuit dies 88. The integrated circuit dies 88 are disposed upon and attached to the top surfaces of each of the die pads 80 of each leadframe 78 as shown in FIG. 10. Also embedded within each mold cap section are conductive wires 90 which are used to mechanically and electrically connect the pads or terminals of each of the integrated circuit dies 88 to the top surfaces of respective ones of the leads 82 of the corresponding leadframe 78. Thus, the package strip 74 comprises the combination of the leadframe strip 76, mold cap sections, semiconductor dies 88 and conductive wires 90 embedded in the mold cap sections.

In accordance with the present invention, it is contemplated that the semiconductor packages included in the package strip 74 may be electrically isolated from each other for allowing strip testing through the formation of a series of first isolation cuts 92 within the package strip 74. Each of the first isolation cuts 92 is preferably formed via waterjet or laser, and extends through the entirety of the package strip 74 including the mold cap sections and leadframe strip 76. As seen in FIG. 9, the first isolation cuts 92 are formed along the lateral and longitudinal saw streets 84, 86. More particularly, the first isolation cuts 92 included along each of the lateral and longitudinal saw streets 84, 86 are separated or spaced from each other by gaps corresponding to the gaps or spaces between each of the sets of leads 82 extending along the corresponding saw street 84, 86. Thus, the first isolation cuts 92 are formed in a manner which effectively separates the leads 82 of adjacent leadframe 78 from each other, thus effectively electrically isolating the leadframes 78 from each other.

In addition to the first isolation cuts 92, formed within the outer frame portion of each leadframe 78 are second isolation cuts 94 which are also each preferably formed via waterjet or laser. Each second isolation cut 94 also extends through the entirety of the package strip 74. As seen in FIG. 10, the second isolation cuts 94 are formed along each of the first leadframe axes 77 and each of the second leadframe axes 79 of each leadframe 78. The second isolation cuts 94 included along each of the first and second leadframe axes 77, 79 are separated or spaced from each other by gaps corresponding to the gaps or spaces between each of the sets of leads 82 extending along the corresponding first and second leadframe axes 77, 79. Thus, the second isolation cuts 94 are formed in a manner which effectively separates adjacent sets of leads 82 within the interior of the outer frame portion of the corresponding leadframe 78 from each other. As a result, the non-peripheral, interior leads 82 of each leadframe 78 are also effectively electrically isolated from each other. The electrical isolation of the leadframes 78 from each other as a result of the first isolation cuts 92 and electrical isolation of the interior leads 82 of each leadframe 78 from each other as a result of the second isolation cuts 94 allows for the completion of subsequent testing procedures prior to the cutting or singulation of the package strip 74 in a manner facilitating the complete separation of the individual semiconductor packages from each other. The first and second isolation cuts 92, 94, though severing the leads 82 from each other, do not cause any resultant burring on the distal ends of the leads 82. Additionally, in the follow-up saw singulation process typically used to facilitate the complete separation of the semiconductor packages of the package strips 74 from each other, the saw blade or wire saw cutter advancing along the lateral and longitudinal saw streets 84, 86 is required to cut through substantially less material of the package strip 74, thus promoting increased singulation speeds and greater longevity in saw blade or wire saw cutter life.

Figure 11:
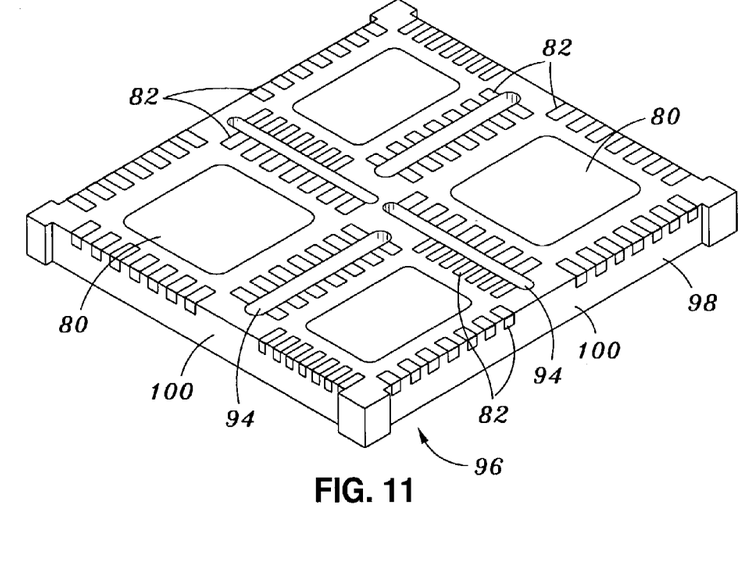
FIG. 11 is a bottom perspective view of a semiconductor package fabricated as a result of the complete singulation of the leadframe strip shown in FIGS. 9 and 10.

FIG. 11 perspectively illustrates a semiconductor package 96 formed as a result of the complete singulation of the package strip 74 including the above-described first and second isolation cuts 92, 94. The complete singulation of the package strip 74 involves the initial formation of the first and second isolation cuts 92, 94 via waterjet or laser. Thereafter, the package strip 74 is subjected to a saw singulation process wherein the above-described saw blade(s) or wire saw cutter(s) are advanced along the lateral and longitudinal saw streets 84, 86. The advancement of such saw blade(s) or wire saw cutter(s) along the lateral and longitudinal saw streets 84, 86 effectively cuts through the mold cap sections and connecting bars of the package strip 74, thus effectively separating the leadframes 78 from each other.

As shown in FIG. 11, as a result of the formation of the first isolation cuts 92 in the package strip 74, the package body 98 of the semiconductor package 96 does not define generally planar side surfaces. Rather, each of the side surfaces of the package body 98 includes a rectangularly configured recess 100 formed therein. As will be recognized, each recess 100 essentially comprises a portion of one of the first isolation cuts 92.

It is contemplated that as an alternative to the use of waterjet or laser, isolation cuts may be formed in the package strip 74 through the use of a chemical etching process. Such isolation cuts would be provided in substantially the same shape and pattern as the first and second isolation cuts 92, 94 described above. However, the isolation cuts formed through the implementation of a chemical etching process would not extend through the entirety of the mold cap sections, but rather would terminate after passing through the metal of the leadframe strip 76. Though not passing through the mold cap sections, the chemically etched isolation cuts would still provide the same advantages described above in relation to the package strip 30.

Figure 12:
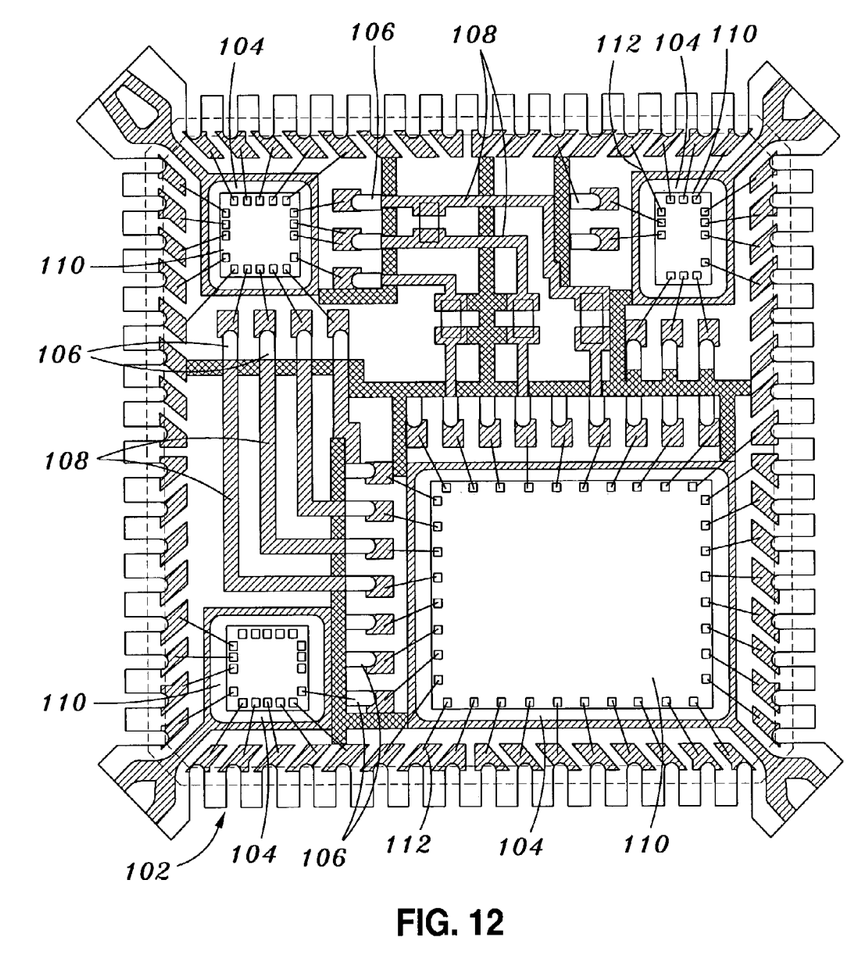
FIG. 12 is a top plan view of a leadframe of an alternatively configured leadframe strip with the corresponding mold cap section removed therefrom and prior to the inclusion of any isolation cuts therein.
Figure 13:
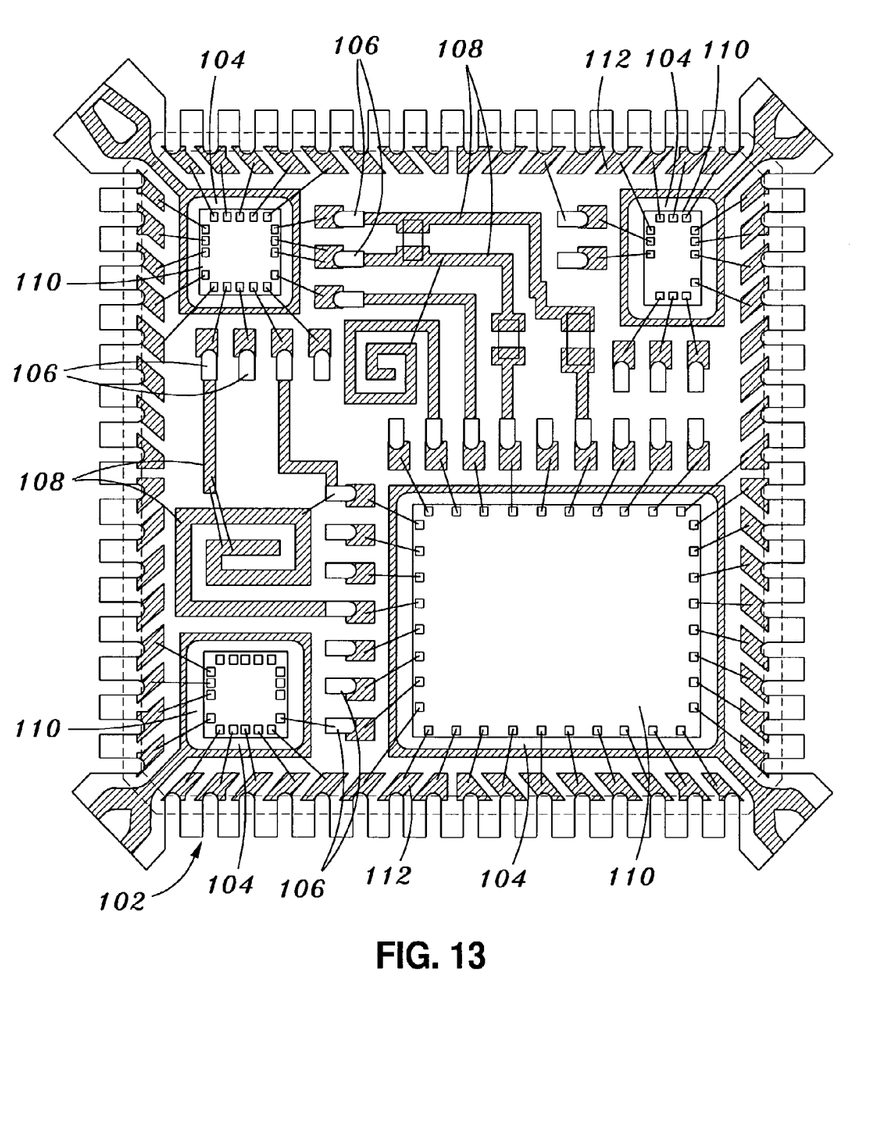
FIG. 13 is a top plan view of the leadframe shown in FIG. 12, with the corresponding mold cap section being removed therefrom and subsequent to the inclusion of the isolation cuts therein in accordance with the present invention.

Though each of the leadframes 78 described above is shown as including four die pads 80, those of ordinary skill in the art will recognize that the number and arrangement of die pads 80 and leads 82 within the outer frame portion of each leadframe 78 may vary without departing from the spirit and scope of the present invention. In this regard, the second isolation cuts 94 would be formed within the interior of the outer frame portion of each leadframe 78 as needed to effectively electrically isolate the interior leads 82 of each leadframe 78 from each other. In this regard, FIGS. 12 and 13 illustrate a leadframe 102 which may be provided as a variant to the leadframe 78. FIG. 12 depicts the leadframe 102 prior to the inclusion of any of the second isolation cuts 94 described above therein, with FIG. 13 depicting the leadframe 102 subsequent to the formation of the second isolation cuts 94. The leadframe 102 includes four die pads 104 which are disposed within the interior of the outer frame portion thereof. The die pads 104 are separated by a complex pattern of leads 106 and conductive traces 108. Subsequent to the electrical connection of the semiconductor dies 110 disposed on the top surfaces of the die pads 104 to the leads 106 through the use of conductive wires 112, the second isolation cuts 94 described above are formed in the leadframe 102 in a manner effectively achieving a desired pattern of electrical isolation between the interior leads 106 and conductive traces 108. Thus, the second isolation cuts 94 may be used to achieve desired patterns of electrical isolation in leadframes having a highly complex configuration, such as the above-described leadframe 102. As in the embodiments described above, such electrical isolation in the leadframe 102 may be achieved by using the chemical etching variation to forming the second isolation cuts 94.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure. For example, waterjet, laser, or etching may be used as an alternative to saw singulation in any of the above-described embodiments to facilitate the complete separation of the semiconductor packages of any package strip from each other.

What is claimed is:

1. A method of fabricating a semiconductor package, comprising the steps of:
   a) providing a leadframe strip defining a strip plane and a multiplicity of leadframes which each include:
      an outer frame defining a central opening; and
      a plurality of leads attached to the outer frame and extending into the central opening in spaced relation to each other;
      the outer frames being integrally connected to each other and collectively defining connecting bars which extend in multiple rows and columns and define saw streets;
   b) positioning semiconductor dies within respective ones of the central openings;
   c) electrically connecting the semiconductor dies to the leads of respective ones of the leadframes;
   d) applying an encapsulant material to the leadframe strip to form at least one mold cap which at least partially encapsulates the leadframes and the semiconductor dies, the leadframe strip and the mold cap collectively defining a package strip; and
   e) forming isolation cuts completely through the package strip along at least some of the saw streets subsequent to forming the at least one mold cap and prior to a singulation of the packaging strip.

2. The method of claim 1 further comprising the step of:
   f) cutting the package strip along the entire length of each of the saw streets in a manner separating the leadframes from each other.

3. The method of claim 1 wherein:
   step (a) comprises providing a leadframe strip wherein the outer frames are integrally connected to each other so as to collectively define connecting bars which define first and second sets of saw streets extending along the strip plane in generally perpendicular relation to each other; and
   step (e) comprises forming the isolation cuts in each of the saw streets of the first and second sets.

4. The method of claim 1 wherein:
   step (a) comprises providing a leadframe strip wherein the outer frames are integrally connected to each other so as to collectively define connecting bars which define first and second sets of saw streets extending along the strip plane in generally perpendicular relation to each other; and
   step (e) comprises forming the isolation cuts along only one of the first and second sets of saw streets.

5. The method of claim 1 wherein step (c) comprises mechanically and electrically connecting the semiconductor dies to the leads of respective ones of the leadframes via conductive wires.

6. The method of claim 1 wherein step (e) is completed through the use of a waterjet.

7. The method of claim 1 wherein step (e) is completed through the use of a laser.

8. A method of fabricating a semiconductor package, comprising the steps of:
   a) providing a leadframe strip defining a strip plane and a multiplicity of leadframes which each include:
      an outer frame defining a central opening;
      a plurality of support bars which extend within the outer frame along respective ones of first and second leadframe axes;
      a plurality of die pads disposed within the central opening and separated from each other by the support bars; and
      a plurality of leads attached to the outer frame and the support bars, the leads extending toward respective ones of the die pads in spaced relation to each other;
      the outer frames being integrally connected to each other and collectively defining connecting bars which extend in multiple rows and columns and define saw streets;
   b) attaching semiconductor dies to respective ones of the die pads of each of the leadframes;
   c) electrically connecting the semiconductor dies of each of the leadframes to respective ones of the leads thereof;
   d) applying an encapsulant material to the leadframe strip to form at least one mold cap which at least partially encapsulates the leadframes and the semiconductor dies, the leadframe strip and the mold cap collectively defining a package strip;
   e) forming first isolation cuts completely through the package strip along at least some of the saw streets subsequent to forming the at least one mold cap; and
   f) forming second isolation cuts through the package strip along at least some of the first and second leadframe axes of each of the leadframes subsequent to forming the at least one mold cap and prior to a singulation of the packaging strip.

9. The method of claim 8 further comprising the step of:
   g) cutting the package strip along the entire length of each of the saw streets in a manner separating the leadframes from each other.

10. The method of claim 8 wherein:
    step (a) comprises providing a leadframe strip wherein the outer frames are integrally connected to each other so as to collectively define connecting bars which define first and second sets of saw streets extending along the strip plane in generally perpendicular relation to each other; and
    step (e) comprises forming the first isolation cuts in each of the saw streets of the first and second sets.

11. The method of claim 8 wherein step (c) comprises mechanically and electrically connecting the semiconductor dies to the leads of respective ones of the leadframes via conductive wires.

12. The method of claim 8 wherein steps (e) and (f) are each completed through the use of a waterjet.

13. The method of claim 8 wherein steps (e) and (f) are each completed through the use of a laser.

14. The method of claim 8 wherein:
    step (a) comprises providing a leadframe strip wherein the support bars of each of the leadframes are arranged to extend along at least two first lead frame axes which extend in spaced, generally parallel relation to each other and at least two second leadframe axes which extend in spaced, generally parallel relation to each other and in generally perpendicular relation to the first leadframe axes; and step (f) comprises forming the second isolation cuts in each of the first and second leadframe axes of each of the leadframes.

15. A method of fabricating a semiconductor package, comprising the steps of:
   a) providing a leadframe strip defining a strip plane and a multiplicity of leadframes which each include:
      an outer frame defining a central opening;
      a plurality of leads attached to the outer frame and extending into the central opening in spaced relation to each other; and
      a die pad disposed within the central opening, the leads attached to the outer frame extending toward the die pad in spaced relation to each other;
      the outer frames being integrally connected to each other and collectively defining connecting bars which extend in multiple rows and columns and define saw streets
   b) attaching semiconductor dies to respective ones of the die pads;
   c) electrically connecting the semiconductor dies to the leads of respective ones of the leadframes;
   d) applying an encapsulant material to the leadframe strip to form at least one mold cap which at least partially encapsulates the leadframes and the semiconductor dies, the leadframe strip and the mold cap collectively defining a package strip; and
   e) forming isolation cuts completely through the package strip along at least some of the saw streets subsequent to forming the at least one mold and prior to a singulation of the packing strip cap.

16. The method of claim 15 further comprising the step of:
   f) cutting the package strip along the entire length of each of the saw streets in a manner separating the leadframes from each other.

17. The method of claim 15 wherein:
   step (a) comprises providing a leadframe strip wherein the outer frames are integrally connected to each other so as to collectively define connecting bars which define first and second sets of saw streets extending along the strip plane in generally perpendicular relation to each other; and
   step (e) comprises forming the isolation cuts in each of the saw streets of the first and second sets.

18. The method of claim 15 wherein:
   step (a) comprises providing a leadframe strip wherein the outer frames are integrally connected to each other so as to collectively define connecting bars which define first and second sets of saw streets extending along the strip plane in generally perpendicular relation to each other; and
   step (e) comprises forming the isolation cuts along only one of the first and second sets of saw streets.

19. The method of claim 15 wherein step (c) comprises mechanically and electrically connecting the semiconductor dies to the leads of respective ones of the leadframes via conductive wires.

20. The method of claim 15 wherein step (e) is completed through the use of a waterjet.

21. The method of claim 15 wherein step (e) is completed through the use of a laser.

* * * * *